US006265889B1

(12) United States Patent
Tomita et al.

(10) Patent No.: US 6,265,889 B1
(45) Date of Patent: Jul. 24, 2001

(54) SEMICONDUCTOR TEST CIRCUIT AND A METHOD FOR TESTING A SEMICONDUCTOR LIQUID CRYSTAL DISPLAY CIRCUIT

(75) Inventors: Satoru Tomita; Nobuo Konda, both of Saitama-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/162,134

(22) Filed: Sep. 29, 1998

(30) Foreign Application Priority Data

Sep. 30, 1997 (JP) .................................................. 9-265875
Jun. 17, 1998 (JP) ................................................ 10-169996

(51) Int. Cl.$^7$ .................................................... G01R 31/02
(52) U.S. Cl. ............................................ 324/765; 324/770
(58) Field of Search ............................... 324/158.1, 73.1, 324/770, 765; 340/645, 653; 365/201

(56) References Cited

U.S. PATENT DOCUMENTS 5,113,134 * 5/1992 Plus et al. ........................... 324/770
5,465,053 * 11/1995 Edwards ............................... 324/770
5,774,100 6/1998 Aoki et al. .
5,994,916 * 11/1999 Hayashi .............................. 324/770

FOREIGN PATENT DOCUMENTS 9 152629 6/1997 (JP) .

* cited by examiner

*Primary Examiner*—Vinh P. Nguyen
(74) *Attorney, Agent, or Firm*—Oblon, Spivak, McClelland, Maier & Neustadt, P.C.

(57) ABSTRACT

A semiconductor test circuit and a method for testing a liquid crystal display device which includes a substrate, first and second busses, signal lines, and first and second switching circuits. The test circuit includes driver circuits configured to drive the first and second semiconductor switching circuits simultaneously and detection circuits configured to detect electric properties between the first and second busses and the first and second semiconductor switching circuits when the driver circuits drive the first and second semiconductor switching elements. The method of testing includes supplying the first and second busses with first and second voltages, driving the first and second semiconductor switching circuits to connect simultaneously the first and second busses to the signal lines, and detecting electric currents when the first and second semiconductor switching circuits are simultaneously driven, thereby checking whether at least one of the first and second semiconductor switching circuits and the busses function correctly.

14 Claims, 9 Drawing Sheets

| SAMPLE # | CONVENTIONAL JUDGEMENT (LINE DEFECTS) | INVENTED JUDGEMENT (LINE DEFECTS) | DISPLAYED RESULT (LINE DEFECTS) |
|---|---|---|---|
| 1 | 0 | 1 | 1 |
| 2 | 0 | 1 | 3 |
| 3 | 0 | 4 | 4 |
| 4 | 0 | 2 | 2 |

SEMICONDUCTOR TEST CIRCUIT AND A METHOD FOR TESTING A SEMICONDUCTOR LIQUID CRYSTAL DISPLAY CIRCUIT

BACKGROUND OF THE INVENTION

Field of the Invention

This invention relates to a semiconductor testing circuit and a method of testing a semiconductor circuit.

The present invention has many applications which include, but not be limited to, a liquid crystal display device in which a plurality of video signals are selected to drive pixels.

A known active matrix-type liquid crystal display device (LCD) has a structure shown in FIG. 13, for example. The LCD includes a circuit array substrate, a counter substrate provided opposite to the array substrate with a counter electrode 16, and a liquid crystal layer 15 held between the array substrate and the counter electrode 16. The array substrate is provided with (m×n) pixel electrodes 14 disposed in a matrix form, m scanning lines Y1 through Ym provided along the columns of the pixel electrodes 14, n signal lines X1 through Xn, thin film transistors (TFTs) 13 provided in the vicinities of crossing points of the scanning lines Y1 through Ym and the signal lines X1 through Xn a scanning line driver circuit 18 to drive the scanning lines Y1 through Ym, and a signal line driver circuit 19 to drive the signal lines X1 through Xn. Each TFT is used for a switching element which supplies a video signal voltage, when it is turned on, in response to a scanning voltage applied to its corresponding scanning line. The pixel electrode 14 and the counter electrode 16 are made of a transparent and electrically conductive material. The counter electrode 16 is driven by a counter electrode driving circuit 20.

The scanning line driver circuit 18 sequentially supplies the scanning voltage to the scanning lines Y1 through Ym during a horizontal scanning period. The signal line driver circuit 19 supplies the video signal voltage to the signal lines X1 through Xn during the horizontal scanning period. The liquid crystal layer 15 is driven by the difference between the video signal voltage supplied to the pixel electrode 14 and predetermined voltages supplied to the counter electrode 16 from the counter electrode driving circuit 20. The liquid crystal layer 15 passes light beams from the pixel electrode 14 to the counter electrode 16 in accordance with its voltage-optical transmission characteristic.

The signal line driver circuit 19 plays an important role in supplying pixel (video) signals to the pixel electrodes 14 If the signal line driver circuit 19 has malfunctions in its output circuit, it stops furnishing pixel signals to rows of the pixel electrodes 14 corresponding thereto and line defects appear on the screen of the liquid crystal display device. Even if only one line defect exists on the screen, it is fatal to the liquid crystal display device. In order to secure its efficiency and reliability, it should not be shipped unless the output of such a signal line driver circuit has been tested. Further, analysis and assessment of actual defects in liquid crystal display devices are useful for increase of the production yield of products to be manufactured from now on. Thus, it is essential to test an output of a key circuit like the signal line driver circuit.

Further, both signal lines and a signal line driver circuit are made on a glass substrate in a driver circuit integrated-type LCD. In this case, since the degree of integration is quite high and a physical space is hardly left to contact the probes to the output terminals, the testing, itself, becomes quite difficult.

As explained above, it is difficult to test the output of the signal driver circuit in the conventional LCDs though such a test is important to secure the reliability and improve the production yield.

SUMMARY OF THE INVENTION

An object of the present invention is to provide a semiconductor test circuit and a method of testing a semiconductor circuit in which many probes are not needed for testing an output of semiconductor circuits.

A semiconductor test circuit of this invention includes a substrate, first and second busses disposed on the substrate which are supplied with first and second voltages, respectively, signal lines disposed on the substrate, first and second semiconductor switching circuits to connect the first and second busses to the signal lines, respectively, driver circuits to drive the first and second semiconductor switching circuits and detection circuits to detect electric properties between the busses and the first and second semiconductor switching circuits when the driver circuits drives simultaneously the first and second semiconductor switching circuits, thereby to check whether the first and second semiconductor switching circuits and/or the busses function correctly.

The semiconductor test circuit further includes scanning lines disposed at substantially right angle with the signal lines, transistors provided in the vicinities of crossing points between the signal lines and the scanning lines, and pixel electrodes connected to the transistors.

In the semiconductor test circuit, the first and second voltages supplied to the first and second busses are different in polarity with respect to a reference voltage.

In the semiconductor test circuit, the first and second semiconductor switching circuits include P-channel and N-channel semiconductor elements, respectively, which have poly-crystalline active layers.

In the semiconductor test circuit, the driver circuits include shift registers.

Further, a testing method of the present invention is applied to a semiconductor circuit which includes a substrate, first and second busses disposed on the substrate, power sources to supply first and second voltages to the first and second busses, signal lines disposed on the substrate, first and second semiconductor switching circuits to connect the first and second busses to the signal lines, respectively, driver circuits to drive the first and second semiconductor switching circuits, and detection circuits to detect electric current passing through the first and second busses. The testing method carries out by supplying the first and second busses with the first and second voltages, respectively, driving the first and second semiconductor switching circuits simultaneously to connect the first and second busses to the signal lines, and enabling the detection circuit to detect the electric current when the first and second semiconductor switching circuits are simultaneously driven so that the detection circuit checks whether the first and second switching circuits and/or the first and second busses function correctly.

In the semiconductor circuit to be examined in accordance with the testing method, a pair of the first and second semiconductor switching circuits is provided to each of the signal lines.

The enabling operation further enables the driver circuit to covert the electric current into an electric resistance.

The detecting operation checks the electric resistance as to whether the first and second switching circuits and/or the first and second busses function correctly.

The semiconductor circuit to be examined in accordance with the testing method further includes a third bus disposed closely at the first and second busses, and the supplying operation further provides the third bus with a third voltage which is different in value from the first and second voltages.

The detecting operation detects the electric current to check whether the third bus is short-circuited with the first or second bus.

The semiconductor circuit to be examined in accordance with the testing method further includes scanning lines disposed at substantially right angle with the signal lines, transistors provided in the vicinities of crossing points between the signal lines and the scanning lines, and pixel electrodes connected to the transistors.

In the semiconductor circuit, the substrate is made of glass and the transistors include active layers made of poly-crystalline silicon.

According to the present invention set forth above, a malfunction of the driver circuit can be detected by observing electric current flowing through the busses which are much smaller in number than the switching circuits. It is unnecessary to directly contact many probes to the driver circuit. Thus, it results in securing the reliability of a semiconductor circuit and improving the production yield.

The above-stated and other objects and advantages of the invention will become apparent from the following description when taken with accompanying drawings. It will be understood, however, that the drawings are for purposes of illustration and are not to be construed as defining the scope or limits of the invention, reference being had for the latter purpose to the claims appended hereto.

DESCRIPTION OF PREFERRED EMBODIMENT

Figure 1:
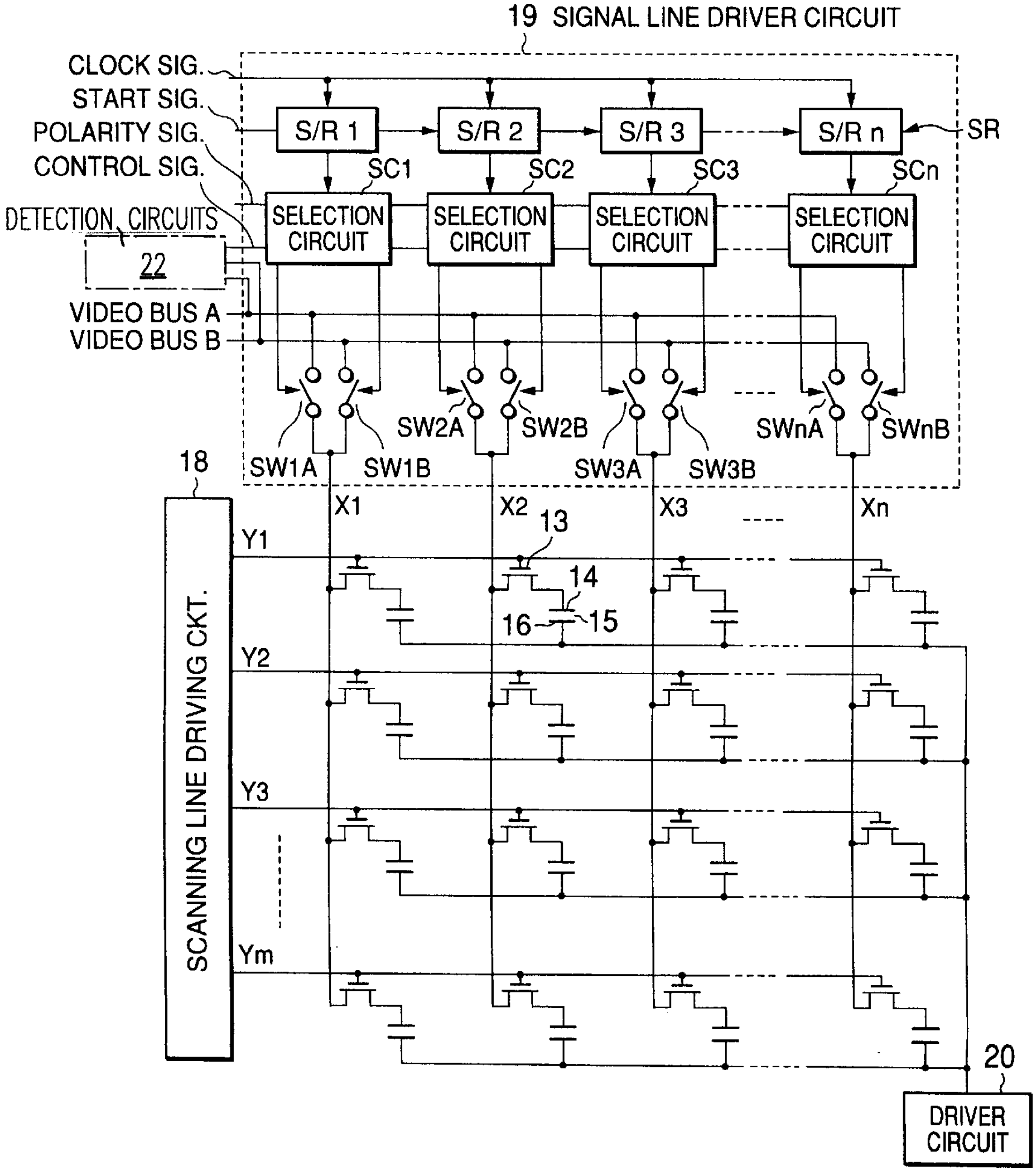
FIG. 1 is an equivalent circuit diagram of an embodiment of a liquid crystal display device in accordance with the present invention.

Embodiments of a semiconductor test circuit and a method of testing a semiconductor circuit of the present invention will be hereinafter explained with reference to the drawings. As a first embodiment, they are applied to liquid crystal display device. FIG. 1 shows a structure of this liquid crystal display device (LCD). The LCD is provided with a circuit array substrate and a counter substrate. The array substrate includes (m×n) pixel electrodes 14, m scanning lines Y1 through Ym disposed along columns of the pixel electrodes 14, n signal lines X1 through Xn disposed along rows of the pixel electrodes 14(m×n) TFTs in the vicinities of points crossed by m scanning lines Y1 through Ym and n signal lines X1 through Xn, a scanning line driver circuit 18 to drive the scanning lines Y1 through Ym, and a signal line driver circuit 19 to drive the signal lines X1 through Xn. The counter substrate includes counter electrodes 16 provided opposite to the pixel electrodes 14 and a counter electrode driving circuit 20 which provides the pixel electrodes 14 with a reference voltage. The TFT 13 at a column supplies signal voltages from the signal lines X1 through Xn to the pixel electrodes 14 when the TFT 13 at such a column is enabled by its corresponding scanning line voltage from the scanning line driver circuit 18 The scanning driving circuit 18 supplies successively scanning signal voltages to the scanning lines Y1 through Ym during a horizontal scanning period. The signal line driver circuit 19 supplies video signal voltages to the signal lines X1 through Xn during the horizontal scanning period. The liquid crystal layer 15 passes incident light at its optical transmission rate which is controlled in accordance with the voltage difference between the video signal voltage at the pixel electrode 14 and the reference voltage provided by a counter electrode driving circuit 20.

The signal line driver circuit 19 will be further described in greater detail. The signal line driver circuit 19 has a shift register SR consisting of n serially connected registers S/R1 through S/Rn, n selection circuit unit units SC1 through SCn, n first analogue switches SW1A through SWnA, n second analogue switches SW1B through SWnB and video busses A and B. The video bus A transmits a positive-polarity video signal supplied from a outer source. The video bus B transmits a negative-polarity video signal which is generated by reversing the polarity of the positive video signal and is supplied from the outer source. The shift registers S/R1 through S/Rn are connected in series and latches a Start Signal in response to a Clock Signal. The Start Signal is supplied from the outer source during the horizontal period. The Clock Signal is also supplied from the outer source in synchronization with the video signal during the horizontal scanning period. At "an image display" mode, the selection circuit unit units SC1 through SCn chose either one of the first analogue switches SW1A through SWnA and the second analogue switches SW/1B through SWnB when the registers S/R1 through S/Rn latch the Start Signal, respectively. Such selection operation is carried out in response to a Polarity Signal, for instance, which is supplied from the outer source and is alternatively reversed every frame. During the positive-polarity frame the first analogue switches SW1A through SWnA are sequentially selected in synchronization with the shifting operation of the shift register SR. The first analogue switches SWLA through SWnA sample and hold a video signal on the video bus A when the switches SW1A through SWnA are chosen by the selection circuit unit units SC1 through SCn, respectively. The first analogue switches SW1A through SWnA provide such a sampled and held video signal to the signal lines X1 through Xn. Similarly, the second analogue switches SW1B through SWnB sample and hold the video signal on the video bus B when the switches SW1B through SWnB are chosen by the selection circuit unit units SC1 through SCn, respectively. The second analogue switches SW1B through SWnB provide such a sampled and held video signal to the signal lines X1 through Xn. In short, such operation as described in the Table 1 is carried out at the "image display" mode. The signal line driver circuit 19 receives a Test Control Signal during an output testing period while connected to a detection circuit 22 to measure currents on the video busses A and B.

In the signal line driver circuit 19, n pairs of the first and second analogue switches SW1A and SW1B, SW2A and SW2B, SW3A and SW3B, . . . , and SWnA and SWnB are allocated to n signal lines, and the shift register SR and the selection circuit units SC1 through SCn sequentially choose one of those n pairs of the analogue switches SW1A and SW1B , SW2A and SW2B, SW3A and SW3B, . . . , and SWnA and SWnB to make the same conductive.

Figure 2:
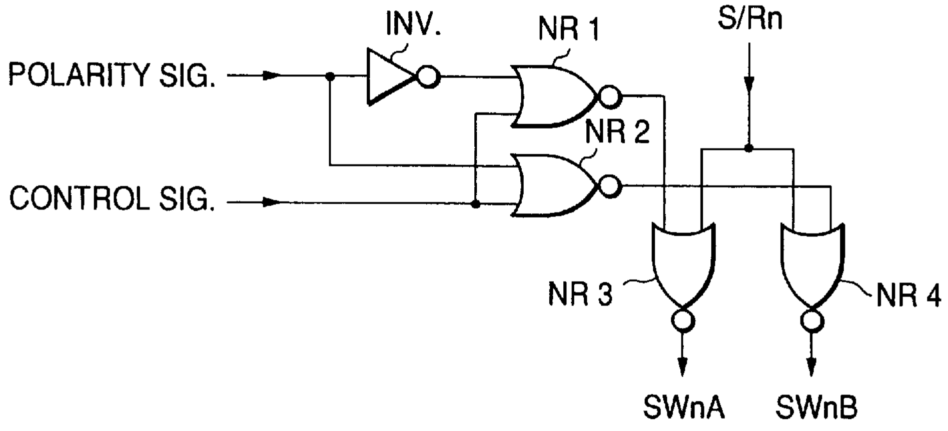
FIG. 2 is a detailed circuit diagram of the selection circuit unit shown in FIG. 1.

FIG. 2 shows a circuit diagram of the selection circuit unit SCn in detail. In this selection circuit unit SCn, the Polarity Signal is supplied to a first input terminal of a NOR gate NR1 through an inverter INV and is also directly supplied to a first input terminal of a NOR gate NR2. The Test Control Signal is supplied to second input terminals of the NOR gates NR1 and NR2. An output signal of the NOR gate NR1 is provided to a first input terminal of a NOR gate NR3. An output signal of the NOR gate NR2 is provided to a first input terminal of a NOR gate NR4. An output signal of the register S/Rn is supplied to second terminals of the NOR gates NR3 and NR4. Output signals of the NOR gates NR3 and NR4 are supplied to the first and second analogue switches SWnA and SWnB, respectively.

With this structure, the selection circuit unit SCn controls to turn "on/off" the analogue switches SWnA and SWnB correspondingly provided for the signal line Xn in response to the input signals of the Polarity Signal and the Control Signal, and the output signal of the register S/Rn during the period to be determined by the resister S/Rn.

The Test Control Signal is digital and one of its high (H) and low (L) levels designates the "image display" mode while another a "test" mode. At the "image display" mode, the selection circuit unit SCn operates as set forth above. At the "test" mode, however, the register S/Rn turns on both the analogue switches SWnA and SWnB regardless of the positive or negative-polarity when the resister S/Rn latches the Start Signal.

The structure and operation of other selection circuit units SC1 through SC(n−1) are substantially the same as described above. Each of the selection circuit units SC1 through SC(n−1), however, is connected to its corresponding register of the shift resister SR and its corresponding analogue switch.

Namely, the selection circuit units SC1 through SCn have the structure shown in FIG. 2 and, when the "test" mode is designated by the control test signal and a pair of the first and second switches are chosen by the shift register SR, the selection circuit units take priority to make both the first and second analogue switches make both the first and second analogue switches conductive at the same time regardless of the Polarity Signal. Table 1 concretely shows the operation of the signal line driver circuit 19.

TABLE 1

| Frame | Period | Turned-on S/R | Polarity | Control Mode | Turned-on SW |
|---|---|---|---|---|---|
| Positive Polarity Frame | T1 | S/R1 | Positive | Image | SW1A |
| | | | | Test | SW1A/SW1B |
| | T2 | S/R2 | Positive | Image | SW2A |
| | | | | Test | SW2A/SW2B |
| | T3 | S/R3 | Positive | Image | SW3A |
| | | | | Test | SW3A/SW3B |
| | . | . | . | . | . |
| | . | . | . | . | . |
| | . | . | . | . | . |
| | Tn | S/Rn | Positive | Image | SWnA |
| | | | | Test | SWnA/SWnB |
| Negative Polarity Frame | T1 | S/R1 | Negative | Image | SW1B |
| | | | | Test | SW1A/SW1B |
| | T2 | S/R2 | Negative | Image | SW2B |
| | | | | Test | SW2A/SW2B |
| | T3 | S/R3 | Negative | Image | SW3B |
| | | | | Test | SW3A/SW3B |
| | . | . | . | . | . |
| | . | . | . | . | . |
| | . | . | . | . | . |
| | Tn | S/Rn | Negative | Image | SWnA |
| | | | | Test | SWnA/SWnB |

Figure 3:
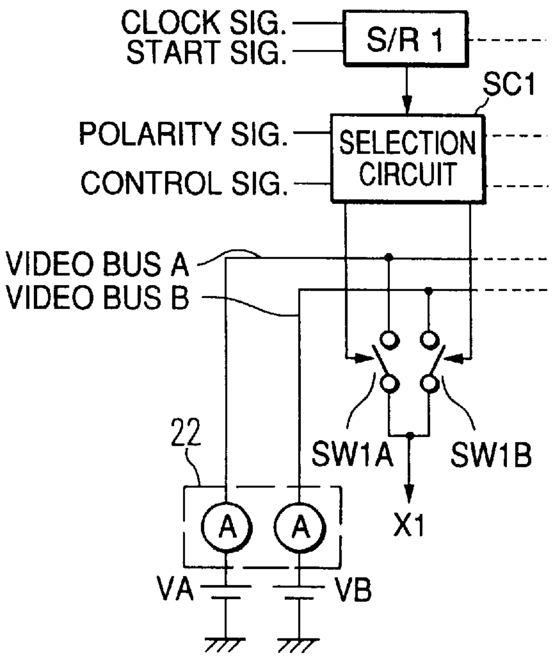
FIG. 3 is an explanatory diagram of a method of testing of outputs of the signal line driver circuit shown in FIG. 1.
Figure 4:
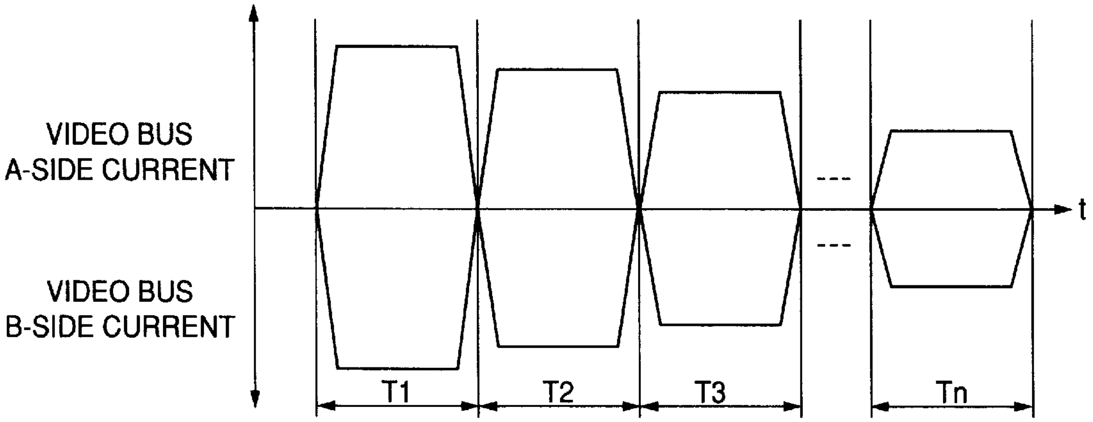
FIG. 4 shows current waveforms at the time when the analogue switches shown in FIG. 1 are all normal in operation.

A method of testing the output signal of the signal line driver circuit 19 will be explained hereinafter. This method is carried out when the "test" mode is setup. FIG. 3 shows a circuit arrangement to measure electric currents flowing in the video busses A and B at the "test" mode. As shown, D.C. power sources VA and VB are connected to the video busses A and B through ammeters, respectively. FIG. 4 shows electric current waveforms flowing from the power sources VA and VB to the video busses A and B, respectively. Those electric current waveforms are observed when n pairs of the first and second analogue switches SW1A and SW1B, SW2A, and SW2B, SW3A and SW3B, . . . , SWNA and SWnB are turned on during the periods T1 through Tn, respectively. The current flows are as described in Table 2

TABLE 2

| Period | Measured Electric Current Path |
|---|---|
| T1 | Video Bus A → SW1A → SW1B → Video Bus B |
| T2 | Video Bus A → SW2A → SW2B → Video Bus B |
| T3 | Video Bus A → SW3A → SW3B → Video Bus B |
| . | . . . . . |
| . | . . . . . |
| . | . . . . . |
| Tn | Video Bus A → SWnA → SWnB → Video Bus B |

In the structure set forth above, the value of the electric currents depends on electric resistance of the video busses VA and VB and turned-on resistance of the first and second analogue switches to be chosen. Since the resistance of the video busses VA and VB is relatively stable, the value of the currents mainly depends on that of the analogue switches. As shown in FIG. 4, the same value but reversed polarity currents flow from the power sources VA and VB. The absolute values of the currents become smaller as the time goes because of the increase in resultant wiring resistance of the video busses VA and VB. If there is no malfunction in the circuit, the waveforms shown in FIG. 4 can be obtained. Thus, malfunction of the analogue switches can be detected by comparing measured waveforms thereof with those shown in FIG. 4 as the reference ones.

(1) Detection of a Mobility Shortage

Figure 5:
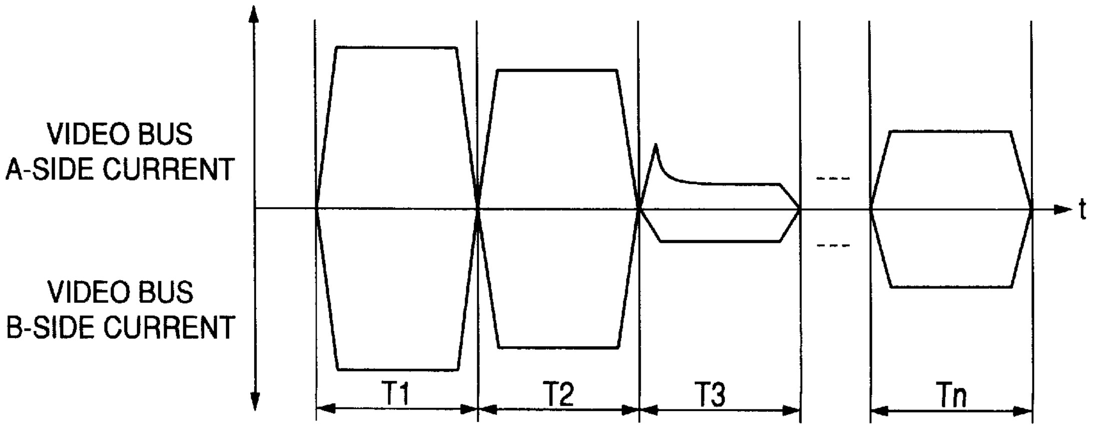
FIG. 5 shows current waveforms at the time when a part of the analogue switches shown in FIG. 1 is poor in mobility.

FIG. 5 shows irregular current waveforms during the period T3. The first and second analogue switches SW3A and SW3B are simultaneously turned on during the period T3. The irregularities indicate a certain malfunction with the second analogue switch SW3B. In this case, it is deemed to be a mobility shortage, i.e., a lower value in mobility than its designed one.

The current values during the period T3 is apparently smaller than those shown in FIG. 4 and at any other periods. Thus, it is detectable that smaller current values are due to the mobility shortage in the analogue switches SW3A and SW3B turned on simultaneously during the period T3 The current waveform of the video bus A during the period T3 has a peak which is different from that of the video bus B. This phenomenon occurs when charging and discharging currents flow from the analogue switch SW3A to signal line capacitance Thus, it can be specified that the mobility shortage takes place with the analogue switch SW3B.

In the liquid crystal display device of the present invention, a mobility shortage of analogue switches can be detected by comparing current waveforms with each other during different periods. One of the first and second analogue switches can be further specified to have such a malfunction by comparing the current waveforms during the same period.

(2) Detection of an Improper Shift in a Threshold Voltage Vth

Figure 6:
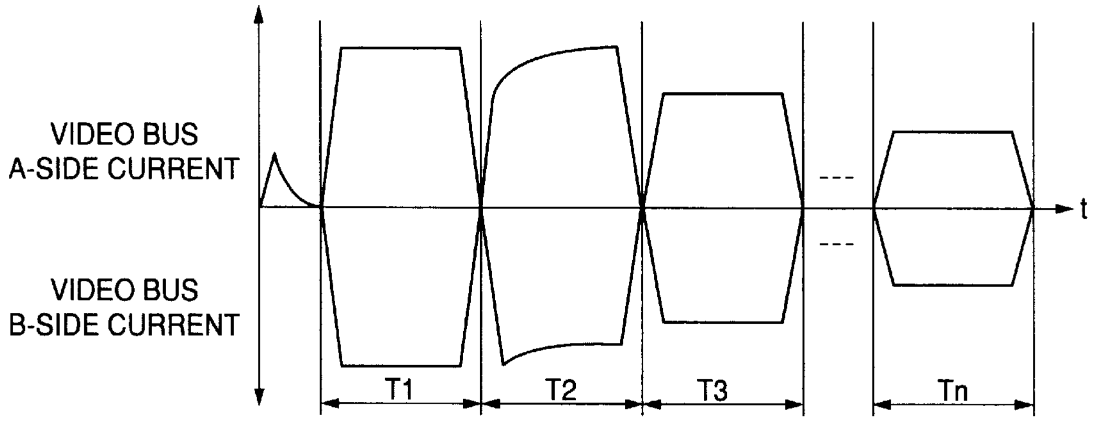
FIG. 6 shows current waveforms at the time when a part of the analogue switches shown in FIG. 1 is insufficient in shift of a threshold voltage.

FIG. 6 shows irregular current waveforms during the period T2 The first and second analogue switches SW2A, and SW2B are simultaneously turned on during the period T2. The irregularities indicate a certain malfunction with the first analogue switch SW2A. Those current waveforms result from an improper shift in threshold voltage of the first switch SW2A. It is due to such a threshold voltage shift that the first analogue switch SW2A, is always kept turned-on regardless of a Control Signal applied thereto.

Where the current waveforms shown in FIG. 6 are measured, a limited current flows through the video bus A before the operation of the shift register SR, i.e., before period T1. If there is no malfunction, no current flows during that period of time because all the analogue switches SW1A through SWnA and SW1B through SWnB are turned off before the operation of the shift register SR. Thus, it is assumed from the existence of a limited current flow before the period T1 that there is an analogue switch which is always kept turned-on because of an improper shift in its threshold voltage Vth.

Further, since the current before the period T1 exists on the side of the video bus A, one of the analogue switches SW1A through SWNA must be always turned on.

Where the current waveforms are observed after the operation of the shift register SR, the current waveforms during the period T2 are not similar to those during the other periods. This results from such a phenomenon that signal line capacitance connected to the turned on analogue switch is charged and discharged by a D.C. voltage source through the video bus A before the operation of the shift register SR. Thus, either one of the analogue switches SW2A, and SW2B turned on simultaneously during the period T2 is always turned on in the event of the improper shift in its threshold voltage Vth.

As described above, since it is ascertained from the observation of the current flow before the operation of the shift register SR that the turned-on analogue switch is connected to the video bus A, the analogue switch SW2A, can be specified to cause the improper shift in the threshold voltage Vth.

The analogue switch which is always turned on because of an improper shift in threshold voltage can be also specified in the liquid crystal display device of this invention.

A second embodiment of the present invention will be described hereinafter with reference to FIG. 7, wherein like reference characters designate like or corresponding elements throughout. The liquid crystal display device is substantially the same in structure except for the following.

Figure 7:
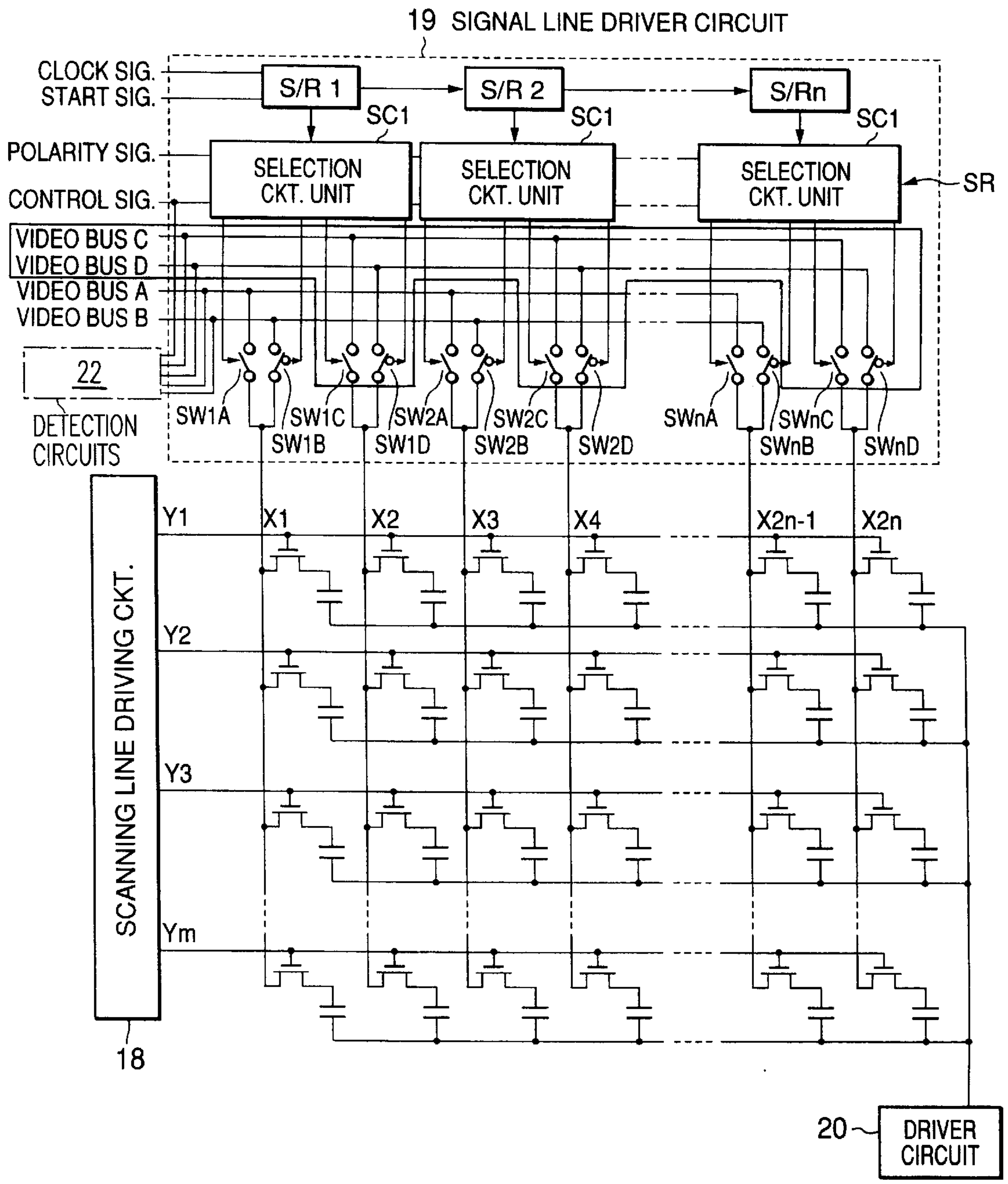
FIG. 7 is an equivalent circuit diagram of a liquid crystal display device which is a second embodiment of the invention.

In the liquid crystal display device shown in FIG. 7, m×2n pixel electrodes 14 are disposed in a matrix form. 2n signal lines X1 through X2n are provided along the pixel electrodes 14. A signal line driver circuit 19 includes n registers S/R1 through S/Rn, n selection circuit units SC1 through SCn, n first analogue switches SW1A through SWnA, n second analogue switches SW1B through SWnB, n third analogue switches SW1C through SWnC, n fourth analogue switches SW1D through SWnD, and video busses A, B, C, and D. The video bus A transmits a positive-polarity, odd-number row pixel signals supplied from an outer source. The video bus B transmit a negative-polarity, odd-number, row pixel signals, reversed-polarity ones to the pixel signals at the video bus A, supplied from the outer source. Similarly, the video buses C and D transmit positive- and negative-polarity, even row pixel signals supplied from the outer source, respectively. The resisters S/R1 through S/Rn are connected in series to function as a shift register. The shift register latches a negative-logic start pulse supplied during a horizontal scanning period by the outer source in response to a clock pulse supplied in synchronization with the pixel signal from the outer source, and outputs a shift pulse in parallel. At the image display mode, the selection circuit unit SCi selects one of the analogue switches SWiA and SWiC and another one of the switches SWiB and SWi1D at the time when the register S/Ri latches the start pulse, (i=1, 2, 3, . . . , n). This selection operation is carried out in response to the polarity signal which is reversed, foe instance, every frame and is supplied from the outer source.

During the positive-polarity frame, an "n"-channel analogue switches SWiA and SWiC, (i =1, 2, 3, . . . , n), are selected in synchronization with the shift operation of the shift register SR. The first analogue switch SWiA, (i=1, 2, 3, . . . , n), samples and a pixel (video) signal on the video bus A at the time when the selection circuit unit SCi selects the switch SWiA, and provides the same to odd-number signal lines X1, X3, X5, . . . , X(2n−1). The third analogue switch SWiC, (i=1, 2, 3, . . . , n), samples and holds a pixel (video) signal on the video bus C at the time when the selection circuit unit SCi selects the switch SWiC, and provides the same to even-number signal lines X2, X4, X6, . . . , X(2n).

During the negative-polarity frame, a "p"-channel analogue switches SWiB and SWiD, (i=1, 2, 3, . . . , n), are selected in synchronization with the shift operation of the shift register SR. The second analogue switch SWiB, (i=1, 2, 3, . . . , n), samples and holds an odd-row pixel (video) signal on the video bus B at the time when the selection circuit unit SCi selects the switch SWiA, and provides the same to odd-number signal lines X1, X3, X5, . . . , X(2n−1). The fourth analogue switch SW1D, (i=1, 2, 3, . . . , n), samples and holds an even-row pixel (video) signal on the video bus D at the time when the selection circuit unit SCi selects the switch SWiC, and provides the same to even-number signal lines X2, X4, X6, . . . , X(2n). The signal line driver circuit 19 receives a test control signal at output test time and is connected to a detection circuit TS to measure current of the video bus A, B, or C.

In the signal line driver circuit 19, n pairs of the first and second analogue switches SW1A through SWnA and SW1B through SWnB are allocated to n odd-number signal lines while those of the third and fourth switches to n even-number signal lines. The shift register SR and the selection circuit units SC1 through SCn select those n pairs of the first through fourth switches SW1A, SW1B, SW1C, and SW1D; SW2A, SW2B, SW2C, and SW2D; . . . ; and SWnA, SWnB, SWnC, and SWnD. A selected pair of analogue switches are allocated to the odd-and even-number signal lines, respectively, and are enabled to be conductive to each other at the same time.

Figure 8:
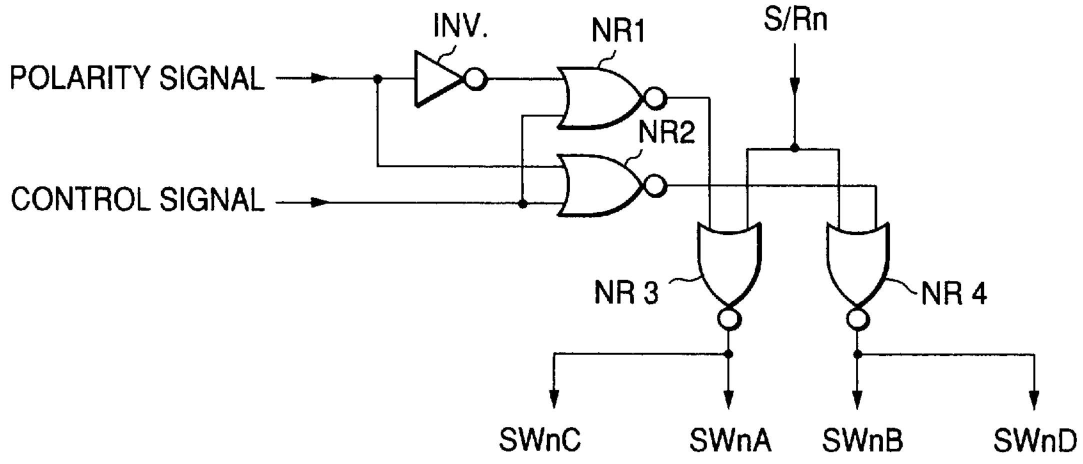
FIG. 8 is a detailed circuit diagram of the selection circuit unit shown in FIG. 7.

FIG. 8 shows a circuit diagram of the selection circuit unit SCn at the final stage. The selection circuit unit in the signal line driver circuit includes a test control circuit and a selection circuit. In FIG. 8, the test control circuit consists of an inverter INV, a NOR gate NR1, and a NOR gate NR2 and the selection circuit includes NOR gates NR3 and NR4. A single test control circuit may be commonly provided for a plurality of the selection circuit units. In this selection circuit unit SCn, the polarity signal is supplied to a first input terminal of the NOR gate NR1 through the inverter INV and to a first input terminal of the NOR gate NR2. Output signals of the NOR gates NR1 and NR2 are provided to first input terminals of the NOR gate NR3 and NR4, respectively. An output signal of the register S/Rn is applied to second input terminals of the Nor gates NR3 and NR4. Outputs of the NOR gates NR3 and NR4 are supplied ton the first and second analogue switches SWnA and SWnB and third and fourth analogue switches SWnC and SWnD, respectively.

The selection circuit unit SCn controls to turn on/off the analogue switches SWnA and SWnB corresponding to the odd-number signal line X(2n−1) and those SWnC and SWnD corresponding to the even-number signal line X2n during the period determined by the register S/R in response to the polarity signal, the test control signal and the output of the register S/Rn.

The test control signal is a two-level digital signal in which one of high (H) and low (L) level signals designates the "image display" mode and the other designates the "test" mode. The selection circuit unit SCn operates the same way as in the first embodiment in response to the "image display" mode. It turns on all the associated analogue switches SWnA, SWnB, SWnC, and SWnD in response to the "test" mode, regardless of any logic value of the polarity signal, at the time when the register S/Rn latches the start pulse.

The other selection circuit units SC1 through SC(n−1) are substantially the same in structure and in operation as the one SCn. Each of the selection circuit units SC1 through SCn is, however, connected to its corresponding register of the shift register and to its analogue switch.

Namely, since the selection circuit units SC1 through SCn consist of the circuit shown in FIG. 8, they control to make conductive all the first through fourth analogue switches successively selected by the shift register, regardless of the polarity signal, when the "test" mode is designated in accordance with the test control signal. Table 3 shows the above-mentioned operation of the signal line driver circuit 9 in detail.

TABLE 3

| Frame | Period | Turned-on S/R | Polarity | Control Mode | Turned-on SW |
|---|---|---|---|---|---|
| Positive Polarity Frame | T1 | S/R1 | Positive | Image | SW1A, SW1C |
| | | | | Test | SW1A–SW1D |
| | T2 | S/R2 | Positive | Image | SW2A, SW2C |
| | | | | Test | SW2A–SW2D |
| | T3 | S/R3 | Positive | Image | SW3A, SW3C |
| | | | | Test | SW3A–SW3D |
| | . | . | . | . | . |
| | . | . | . | . | . |
| | . | . | . | . | . |
| | Tn | S/Rn | Positive | Image | SWnA, SWnC |
| | | | | Test | SWnA–SWnD |
| Negative Polarity Frame | T1 | S/R1 | Negative | Image | SW1B, SW1D |
| | | | | Test | SW1A–SW1D |
| | T2 | S/R2 | Negative | Image | SW2B, SW2D |
| | | | | Test | SW2A–SW2D |
| | T3 | S/R3 | Negative | Image | SW3B, SW3D |
| | | | | Test | SW3A–SW3D |
| | . | . | . | . | . |
| | . | . | . | . | . |
| | . | . | . | . | . |
| | Tn | S/Rn | Negative | Image | SWnB, SWnD |
| | | | | Test | SWnA–SWnD |

Figure 9:
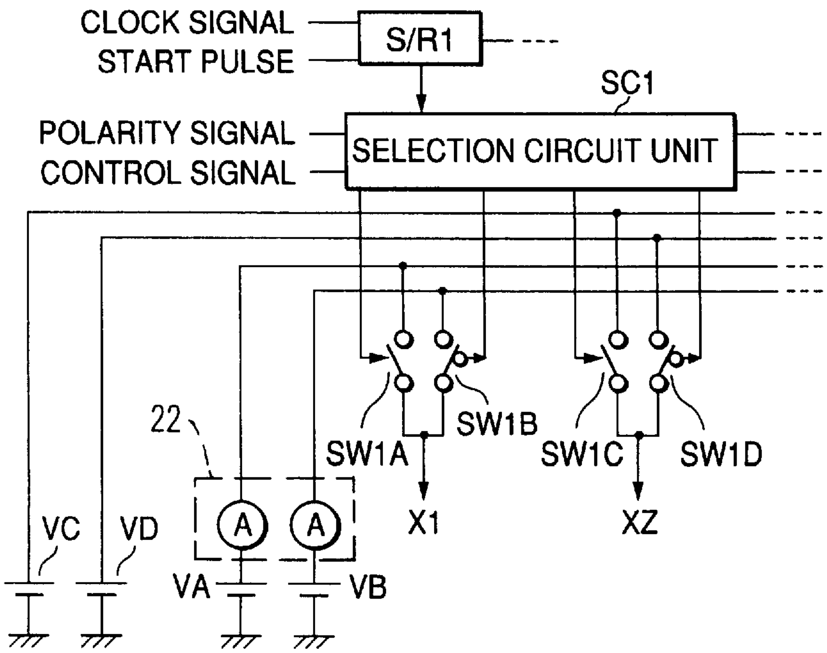
FIG. 9 is a circuit diagram to explain a method of testing an output of a signal line driver circuit shown in FIG. 7.

A method of testing the output signal of the signal line driver circuit 19 will be explained hereinafter. This method is carried out when the "test" mode is setup. FIG. 9 shows a circuit arrangement to measure electric currents flowing in the video busses A and B at the "test" mode. D.C. power sources VA and VB are connected to the video busses A and B through ammeters, respectively. Also, D.C. power sources VC and VD are connected to the video busses C and D, respectively. Voltage values among them are; VA ≠VB, VC≠VA, VC≠VB, VD≠VA, and VD≠VB. An average value of voltages applied to the video busses A and B is set to be different from an average one of those applied to the video busses C and D which are not tested. FIG. 4 shows electric current waveforms flowing from the power sources VA and VB to the video busses A and B, respectively. Those electric current waveforms are measured when n sets of the first through fourth analogue switches SW1A through SW1D, SW2A, through SW2D, SW3A through SW3D, . . . , SWnA through SWnD are successively turned on during the periods T1 through Tn, respectively. The current flowing path is;

The Video bus A→ the first analogue switch→ the second analogue switch→ video bus B Further, the current flowing paths at the period T1 through Tn are the same as shown in Table 3 in the first embodiment, respectively.

In the structure set forth above, the value of the electric currents depends on electric resistance of the video busses VA and VB and turned-on resistance of the first and second analogue switches to be chosen. Since the resistance of the video busses VA and VB is relatively stable, the value of the currents mainly depends on that of the analogue switches. As shown in FIG. 4, the same value but reversed polarity currents flow from the power sources VA and VB. The absolute values of the currents become smaller as the time goes because of the increase in resultant wiring resistance of the video busses VA and VB. If there is no malfunction in the circuit, the waveforms shown in FIG. 4 can be obtained. Thus, malfunction of the analogue switches can be detected by comparing measured waveforms thereof with those shown in FIG. 4 as the reference ones.

(3) Short Circuit Between Busses

As set forth above, voltages applied to the video busses A, B, C, and D are set to be different in value. Thus, if a short circuit occurs between the video busses, the voltages on them are different in value than the ordinary ones so that such a short circuit can be detected.

When the video bus A is short-circuited with the video bus C, for instance, due to insufficient treatment in an etching process, the voltage of the video bus A becomes an intermediate value between the voltages VA and VC, which is never the voltage VA. Thus, the current value is different from its ordinary one and the occurrence of a malfunction can be detected. In addition, since the voltages of the video busses are different, a short-circuited video bus can be identified.

(4) Video Bus Break

When one video bus is broken, no current path is available to the other busses connected to the broken bus. As a result, the current value becomes small so that the broken bus can be detected.

If the video bus B, for example, is broken between the analogue switches SW1B and SW2B due to improper treatment of a photo-engraving process, the current value is normal during the period T1 but the current values during the period T2 and thereafter become small in comparison with the ordinary ones thereof. Thus, the occurrence of a break of a bus and a broken bus are detectable.

(5) Short Circuit Between Video Busses

A short circuit between video busses is not a malfunction of the signal line driver circuit but that of the pixels. The test method of the present invention can detect such a malfunction.

For instance, the signal line X3 is short-circuited with the line X4 due to conductive dust. If transistor characteristics of the analogue switches and the resistance values of the video busses are normal in this case, the voltage of the signal line X4 becomes a mean value of (VA+VB)/2 between the voltages of the video busses A and B. Since the voltages VA, VB, VC, and VD of the video busses A, B, C, and D are set to be different from each other, the voltages of the signal lines X3 and X4 are changed in the case of the occurrence of the short circuit between the signal lines X3 and X4. Namely, since the voltages of the current paths to be measured are changed in this case, the current values to be measured become abnormal so that the short circuit can be detected.

(6) Short Circuit Between Signal and Scanning Lines

This short circuit between video busses is also not a malfunction of the signal line driver circuit but that of the pixels. The test method of the present invention can detect such a malfunction.

If the signal line X3, for instance, is short-circuited with one of the scanning lines due to an improper isolation layer, the voltage of the signal line X3 becomes different from the ordinary value of (VA+VB) because of influence of the scanning line driver circuit 18 Since the voltages of the current paths to be measured are changed in this case, the current values to be measured become abnormal so that the short circuit can be detected.

Remarkable features in the embodiments of the present invention are that only the input terminals of the video busses A and B are good enough points to measre the current. As a result, the number of measuring points to be probed can be more greatly reduced than that of the signal lines. It is unnecessary to prepare expensive, large-scale probe cards for testing circuits. Even though the signal line driver circuit 19 is integrated on the circuit array substrate, testing of the highly integrated circuit 19 can be carried out without contacting probes on highly dense circuit portions in the vicinity of the output sectuion of the circuit 19.

In the embodiments, both the video busses A and B are subject to testing. One of them, however, may be tested. In this case, although the accuracy of measurement becomes slightly lowered, a practical test can be carried out. In particular, whether a malfunction occurs or not can be detected.

The thin film transistors 13 together with the scanning driver circuit 18 and the signal driver circuit 19 may be made of poly-crystalline silicon semiconductor films integrated on the circuit array substrate. More particularly, the analogue switches SW1A through SWnD of the signal line driver circuit 19 in the liquid crystal display devices shown in FIGS. 1 and 7 may consist of non-linear switching elements of n-channel, p-channel, or complementary-type thin film transistors made of poly-crystalline silicon.

Figures 11, 12:
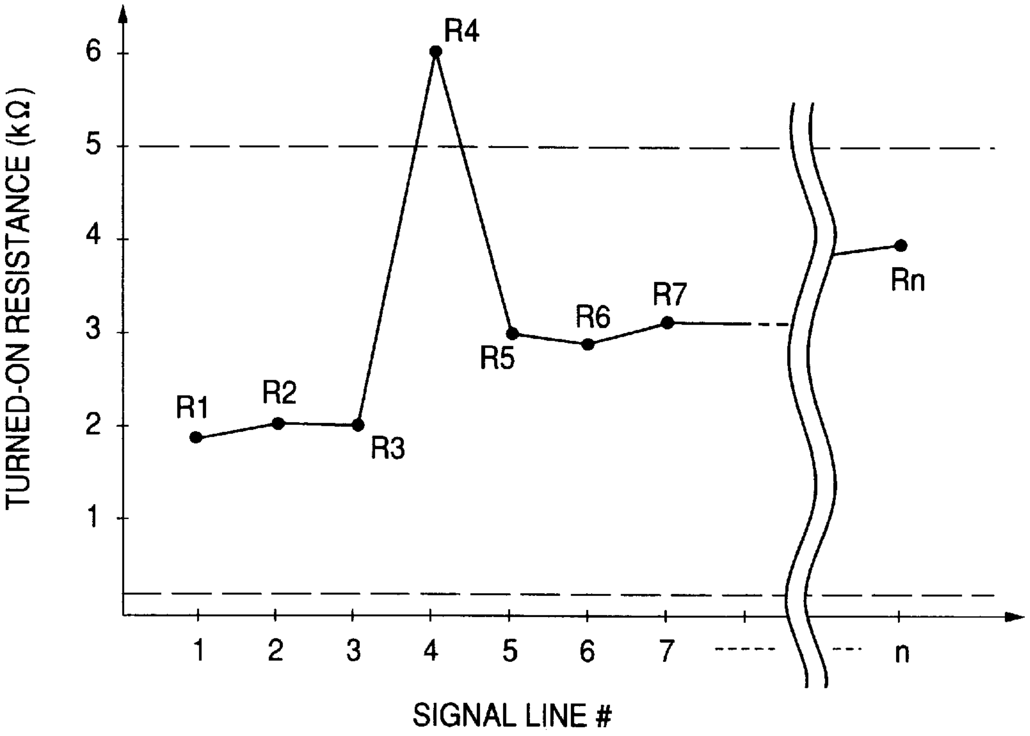
FIG. 11 is a graph to indicate result of a conventional test method.
FIG. 12 is a comparison list of test results.
Figure 13:
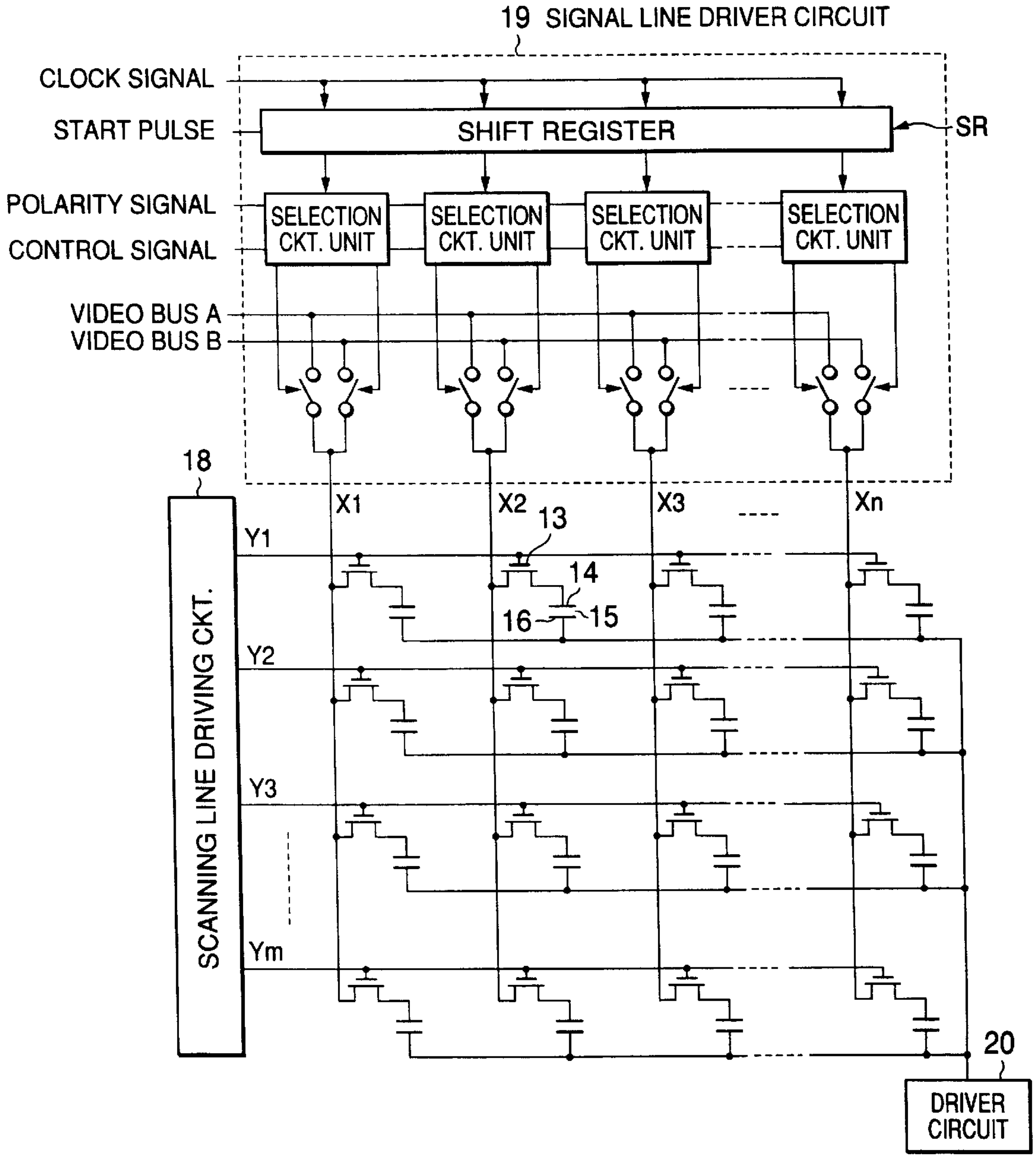
FIG. 13 PRIOR ART
FIG. 13 is an equivalent circuit diagram of a conventional liquid crystal display device.

Application of such poly-crystalline silicon films will be hereinafter described with respect to the analogue switches SW1A through SWnA and SW1B through SWnB of the liquid crystal display device shown in FIG. 1 as an example. The analogue switches SW1A through SWnA and SW1B through SWnB are the p-channel and n-channel thin film transistors PT and NT as shown in FIG. 11. When one pair of the paired analogue switches SW1A and SW1B, SW2A, and SW2B, . . . , and SWnA and SWnB connected to the common signal lines, respectively, is enabled to be conductive at the same time, the resistance difference between such one pair of the analogue switches is set to be 200Ω or smaller.

With this structure, there develop hereinafter measurement of turned-on resistance of the paired analogue switches and judgement as to whether the paired analogue switches are good or not in the light of the measured resistance. When the analogue switches are tested, the video bus A is connected between a pad PDA and an ammeter connected to the D.C. power source VA while the video bus B is connected between a pad PDB and the D.C. power source VB.

Figure 10:
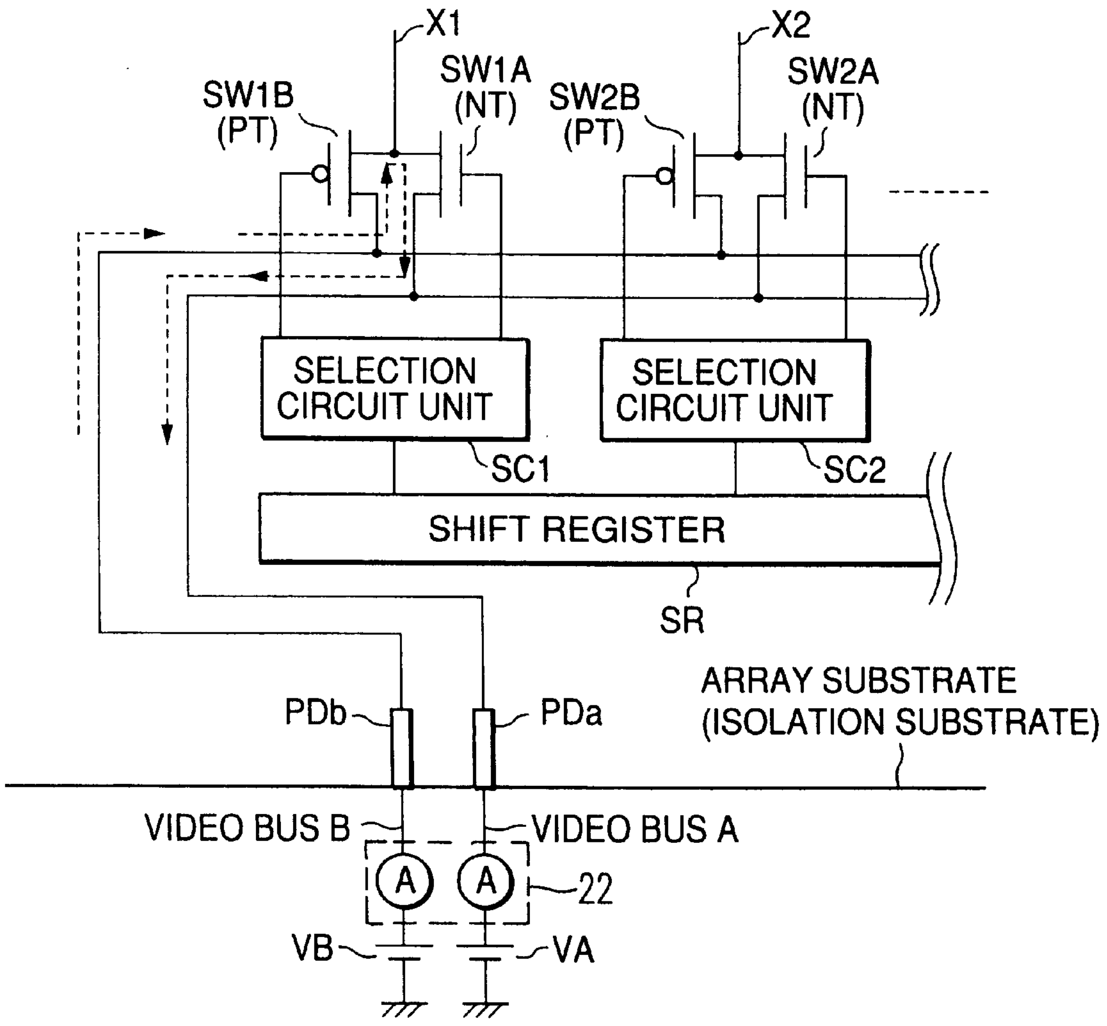
FIG. 10 is a schematic circuit diagram of a liquid crystal display device in which analogue switches consist of poly-crystalline thinfilm transistors.

Connected to the D.C. power sources VA and VB, the channels of the thin film transistors PT and NT become low in resistance simultaneously in response to voltages applied to the gates of the transistors. If the voltage of the D.C. power source VB is larger than that of the D.C. power source VA, current flows through the D.C. power source VB, the p-channel thin film transistor PT, the n-channel thin film transistor NT and the D.C. power source VA as indicated by doted arrows in FIG. 10. The current value is measured by the ammeter.

The turned-on resistance value of each of the paired analogue switches can be calculated from the potential difference between the D.C. power sources VA and VB and the measured current value.

When the turned-on resistance of the paired analogue switches for all the signal lines X1 through Xn, the paired thin film transistors PT and NT respectively allocated to the signal lines X1 through Xn are turned on in due order and all the current value are measured in that order. In this way, the turned-on resistance for all the paired analogue switches corresponding to the signal lines can be measured.

It will be explained hereinafter with reference to actual data whether paired analogue switches are good or not in the light of the resistance value. FIG. 11 shows a judgement result in accordance with a conventional method. Reference numerals R1 through Rx and X1 through Xn represent the turned-on resistance values and the signal lines corresponding to the resistance values, respectively. In this example, the resistance value ranging between 200Ω and 5,000Ω is judged to be torelable. This judgement is not well consistent with actual devices.

The inventors of the present invention have investigated the relationship between display quality of the actual device and the turned-on resistance of paired analogue switches. As a result, the inventors have discovered that comparison between the turned-on resistance values of paired analogue switches connected to neighboring ones of the signal lines is well consistent with the actual display quality.

Its theory will be described hereinafter by using formulas. The turned-on resistance value Rx of x-th paired analogue switches, (x; a corresponding signal line number), to be tested and the turned-on resistance value Rn of n-th paired analogue switches, (n; a corresponding signal line), connected to the signal line corresponding thereto are defined to begin with. When the paired analogue switches to be tested are compared with p pairs of the paired analogue switches, (p<x), before the former, the turn-on resistance difference RΔ is described by the following equation (1).

$$R\Delta = Rx - \left(\sum_{n=x-p}^{x-1} Rn\right) \Big/ p \tag{1}$$

When the former are compared with those after the former, the resistance difference RΔ is expressed by the equation (2).

$$R\Delta = Rx - \left(\sum_{n=x+p}^{x+1} Rn\right) \Big/ p \tag{2}$$

As set forth above, the paired analogue switches to be tested are compared with a predetermined number of those before and after the former. If the resistance difference RΔ is satisfied with the following value, the switches are judged to be good.

$$|R\Delta| \leq 200$$

Further, it is verified by using the actual device. The tested, paired analogue switches are compared with two previous and two following ones (i.e., p=2 in the equations (1) and (2)). Since the display device includes the circuit structure shown in FIG. 10, longitudinal lost lines are recognizable in the vertical direction on the display screen (called longitudinal line defects) if some analogue switches are not good. FIG. 12 indicates judgement results.

As shown in FIG. 12, the conventional method of comparing actually measured turned-on resistance values of paired analogue switches detects no longitudinal line defects in all the samples. The actual display devices are different from the results.

The method of the present invention, which compares turned-on resistance values of paired analogue switches connected to neighboring signal lines, has provided results which, excepts for the sample 2, are fairly consistent with the actual display device situations. In addition, the method of this invention can detect where some malfunctions take place. According to the present invention, the test of a pair of analogue switches can be carried out rapidly and accurately. Thus, poor products can be eliminated at early production stages so that productivity can be substantially increased. Finally, since malfunction or defect portions can be easily detected, it is possible to analyze them and to set up countermeasures therefor.

Many apparently widely different embodiments of this invention may be made without departing from the spirit and scope thereof. For instance, the test control circuits each consisting of the inverter INV and the NOR gates NR1 and NR2 as shown in FIGS. 2 and 8 may be removed from the selection circuit units and a single logic circuit formed on the circuit array substrate be commonly provided for all the selection circuits. The logic circuit, however, also consists of the inverter INV and the NOR gates NR1 and NR2. Thus, an output of the logic circuit is commonly supplied to each selection circuit consisting of the NOR gates NR3 and NR4.

What is claimed is:

1. A semiconductor test circuit configured to test a liquid crystal display which includes, a substrate, first and second busses disposed on said substrate and being supplied with first and second voltages, respectively, signal lines disposed on said substrate, and first and second semiconductor switching circuits configured to connect said first and second busses to said signal lines, respectively, said test circuit comprising:

driver circuits configure to drive simultanously said first and second semiconductor switching circuits; and detection circuits configured to detect electric properties between said buses and said first and second semiconductor switching circuits when said driver circuits drive simultaneously said first and second semiconductor switching circuits, thereby to check whether at least one of said first and second semiconductor switching circuits and said busses function correctly.

2. The semiconductor test circuit according to claim 1, wherein said substrate further includes scanning lines disposed at substantially right angle with said signal lines, transistors provided in the vicinity of crossing points between said signal lines and said scanning lines, and pixel electrodes connected to said transistors.

3. The semiconductor test circuit according to claim 2, wherein said first and second voltages supplied to first and second busses are different in polarity with respect to a reference voltage.

4. The semiconductor test circuit according to claim 3, wherein said first and second semiconductor switching circuits include P-channel and N-channel semiconductor elements, respectively.

5. The semiconductor test circuit according to claim 4, wherein said P-channel and N-channel semiconductor elements include poly-crystalline active layers, respectively.

6. The semiconductor test circuit according to claim 1, wherein said driver circuits include shift registers.

7. A method of testing a semiconductor circuit including, a substrate, first and second busses disposed on said substrate and configured to supply first and second voltages to said first and second busses, signal lines disposed on said substrate, driver circuits, first and second semiconductor switching circuits configured to connect said first and second busses to said signal lines, respectively, and detection circuits configured to detect electric current passing through said first and second busses, comprising the steps of:

supplying said first and second busses with said first and second voltages, respectively;

driving said first and second semiconductor switching circuits by said driver circuit to connect simultaneously said first and second busses to said signal lines; and enabling said detection circuits to detect said electric current when said first and second semiconductor switching circuits are simultaneously driven in said driving step, thereby to check whether at least one of said first and second switching circuits and said first and second busses function correctly.

8. The method of testing a semiconductor circuit according to claim 7, wherein a pair of said first and second semiconductor switching circuits is provided to each of said signal lines.

9. The method of testing a semiconductor circuit according to claim 8, wherein said enabling step further enables one of said driver circuits to covert said electric current into an electric resistance.

10. The method of testing a semiconductor circuit according to claim 9, wherein said detecting step checks said electric resistance as to whether at least one of said first and second switching circuits and said first and second busses function correctly.

11. The method of testing a semiconductor circuit according to claim 7, wherein said semiconductor circuit further includes a third bus disposed closely at said first and second busses, and wherein said supplying step further provides said third bus with a third voltage which is different in value from said first and second voltages.

12. The method of testing a semiconductor circuit according to claim 11, wherein said detecting step detects said electric current thereby to check whether said third bus is short-circuited with said first or second bus.

13. The method of testing a semiconductor circuit according to claim 7, wherein said semiconductor circuit further includes scanning lines disposed at substantially right angle with said signal lines, transistors provided in the vicinities of crossing points between said signal lines and said scanning lines, and pixel electrodes connected to said transistors.

14. The method of testing a semiconductor circuit according to claim 13, wherein said substrate is made of glass and wherein said transistors include active device layers made of poly-crystalline silicon.

* * * * *